United States Patent
Moedinger et al.

(10) Patent No.: US 10,044,144 B2
(45) Date of Patent: Aug. 7, 2018

(54) PLUG CONNECTOR AND COMPONENT

(71) Applicant: ERNI Production GmbH & Co. KG, Adelberg (DE)

(72) Inventors: Roland Moedinger, Weinstadt (DE); Stefan Molitor, Waeschenbeuren (DE); Juergen Lappoehn, Gammelshausen (DE); Thomas Gneiting, Frickenhausen (DE)

(73) Assignee: ERNI Production GmbH & Co. KG, Adelberg (DE)

( * ) Notice: Subject to any disclaimer, the term of this patent is extended or adjusted under 35 U.S.C. 154(b) by 0 days.

(21) Appl. No.: 15/326,121

(22) PCT Filed: Jul. 1, 2015

(86) PCT No.: PCT/DE2015/100275
§ 371 (c)(1),
(2) Date: Jan. 13, 2017

(87) PCT Pub. No.: WO2016/008473
PCT Pub. Date: Jan. 21, 2016

(65) Prior Publication Data
US 2017/0229816 A1    Aug. 10, 2017

(30) Foreign Application Priority Data
Jul. 14, 2014    (DE) .................. 10 2014 109 867

(51) Int. Cl.
*H01R 9/03*    (2006.01)
*H01R 13/6471*    (2011.01)
(Continued)

(52) U.S. Cl.
CPC ....... *H01R 13/6471* (2013.01); *H01R 12/716* (2013.01); *H01R 13/658* (2013.01); *H01R 13/665* (2013.01); *H01R 13/6616* (2013.01)

(58) Field of Classification Search
CPC ............ H01R 13/6471; H01R 13/6658; H01R 12/716; H01R 13/659; H01R 13/514; H01R 13/658; H01R 13/665; H01R 13/518
(Continued)

(56) References Cited

U.S. PATENT DOCUMENTS 5,228,871 A    7/1993    Goodman
6,129,591 A    10/2000    Czeschka
(Continued)

FOREIGN PATENT DOCUMENTS

DE    42 22 452 A1    1/1993
DE    93 12 470 U1    10/1993
(Continued)

OTHER PUBLICATIONS

International Search Report of PCT/DE2015/100275, dated Oct. 5, 2015.
(Continued)

*Primary Examiner* — Jean F Duverne
(74) *Attorney, Agent, or Firm* — Collard & Roe, P.C.

(57) ABSTRACT

A plug connector which comprises contact elements that are subdivided into at least one signal contact element and at least one shielding contact element, and a component having an electrical circuit ground. The plug connector and the component are characterized by an ohmic resistance which connects the shielding contact element to the electrical circuit ground. The measure suppresses parasitic oscillations.

16 Claims, 5 Drawing Sheets

Figure 1:
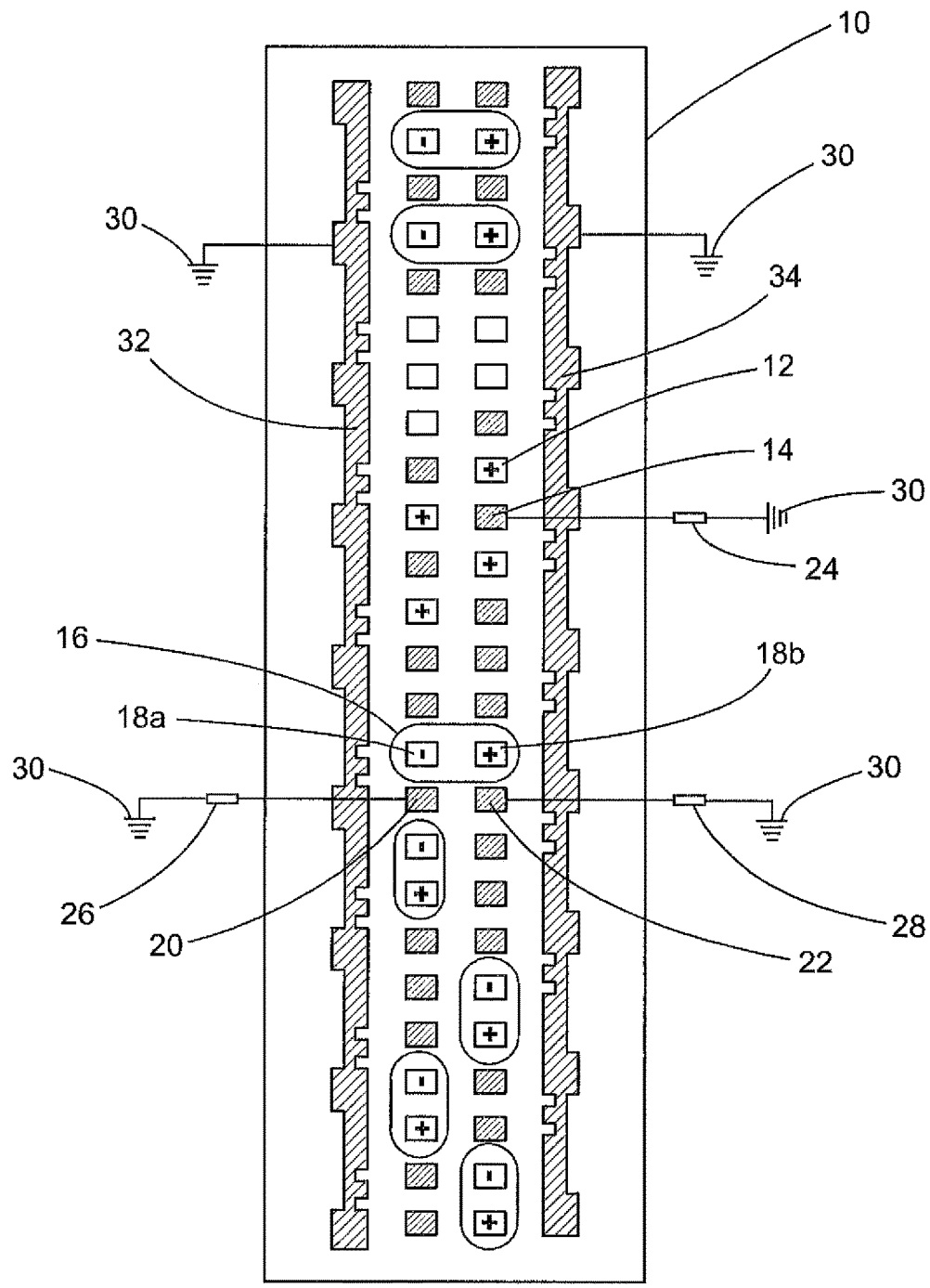

(51) Int. Cl.
*H01R 13/658* (2011.01)
*H01R 13/66* (2006.01)
*H01R 12/71* (2011.01)

(58) Field of Classification Search
USPC .................................................. 439/607.05
See application file for complete search history.

(56) References Cited

U.S. PATENT DOCUMENTS

| | | | |
|---|---|---|---|
| 6,568,966 B1 * | 5/2003 | Korsunsky ......... | H01R 13/6658 439/620.06 |
| 6,623,301 B2 | 9/2003 | Lappoehn | |
| 6,761,595 B1 * | 7/2004 | Zheng .................. | H01R 13/514 439/620.01 |
| 6,910,917 B2 * | 6/2005 | Chen .................... | H01R 13/518 439/490 |
| 6,976,886 B2 | 12/2005 | Winings et al. | |
| 7,294,024 B2 * | 11/2007 | Hammond, Jr. ... | H01R 13/6471 439/607.05 |
| 7,393,218 B1 | 7/2008 | Pavlovic et al. | |
| 7,674,136 B2 * | 3/2010 | Steinke ............... | H01R 13/514 439/541.5 |
| 7,928,608 B1 | 4/2011 | Lyons et al. | |
| 9,397,450 B1 * | 7/2016 | Feng .................... | H01R 13/659 |
| 9,531,109 B2 * | 12/2016 | Gao .................... | H01R 12/716 |
| 2003/0087559 A1 | 5/2003 | Korsunsky et al. | |

FOREIGN PATENT DOCUMENTS

| | | |
|---|---|---|
| DE | 197 27 092 A1 | 1/1998 |
| DE | 198 07 713 A1 | 6/1999 |
| DE | 101 19 695 A1 | 11/2002 |
| DE | 10 2008 006 340 A1 | 9/2008 |
| GB | 2 314 697 A | 1/1998 |

OTHER PUBLICATIONS

Meinke and Gundlach "Taschenbuch der Hochfrequenztechnik" ("Handbook for high frequency technology"), Springer-Verlag 1956, pp. 6-15, 48-49, and 158-169 (27 pages).

* cited by examiner

PLUG CONNECTOR AND COMPONENT

CROSS REFERENCE TO RELATED APPLICATIONS

This application is the National Stage of PCT/DE2015/100275 filed on Jul. 1, 2015, which claims priority under 35 U.S.C. § 119 of German Application No. 10 2014 109 867.6 filed on Jul. 14, 2014, the disclosure of which is incorporated by reference. The international application under PCT article 21(2) was not published in English.

The invention relates to a plug connector and a component having an electrical circuit ground according to the type of independent device claim.

The invention further relates to a use of the plug connector according to the invention and the component.

PRIOR ART

The published patent application DE 197 27 092 A1 describes a shielded electrical plug connector that contains shielded loops. The shielding loops are arranged in several groups, whereby there is a multitude of cable runs which can be connected to an electrical circuit ground of a circuit board. Because of the special arrangement, a low inductive connection of the shielding to the electrical circuit ground is obtained, whereby the effectiveness of the shielding at higher signal frequencies is optimised.

The published patent application DE 10 2008 006 340 A1 describes a plug connector having a shaped shielding housing. A first stripped cable section is contacted by a terminal element, for example by means of crimping. The corresponding cable section is additionally contacted by an earth rail via a shielding. The earth rail is preferably formed from a material with low electrical impedance in order to enable controlling the earthing resistor for the shielding. A conductive plug connector seal element seals possible leakage current paths for high frequency disturbances and reduces the impedance of a connection between the shielding and the electrical circuit ground. In doing so, the connection between the shielding and the electrical circuit ground or the earth rail is implemented with as low a level of impedance as possible in order to ensure an effective shielding at high frequencies.

The published patent application DE 42 22 452 A1 describes a shielded plug connector. The relatively thin ground and shielding contacts inserted on their edges form a connection which bites into a conducting shielding and ground layer of the inserted plug connector and thus forms a stable electrical connection of the shielding and ground wire with as low an impedance as possible.

The utility model specification DE 93 12 470 U1 relates to a coaxial plug connector. The known plug connector provides the opportunity to automatically connect and disconnect a terminal resistor in an antenna socket, said terminal resistor then being looped in between a neutral conductor, i.e. a signal contact element, and an outer sleeve against the electrical circuit ground, if no complementary plug connector is inserted into the plug connector. The value of the terminal resistor should correspond to the surge impedance of the antenna wire.

In the published patent application DE 101 19 695 A1, a plug connector is described, in which the two plug connection elements of the plug connector are provided in each case with shielding plates. The shielding plates substantially lie completely one on top of the other in the contacted state of the two plug connection elements, whereby a low inductive and altogether low ohmic shielding signal path is achieved.

In the published patent application U.S. Pat. No. 6,976,886 B2, a plug connector is described, in which a high shielding effect of the signal guiding wire against one another and of the plug connector altogether is to be achieved by a special arrangement and alignment of the signal guiding and shielding or ground potential guiding contact elements relative to one another. The known plug connector is especially suitable for high frequency signals, wherein the arrangement of the signal guiding and ground potential guiding contact elements is furthermore especially predetermined for achieving a particular surge resistance.

In the published patent application DE 198 07 713 A1, a plug connector is described that contains a large number of contact elements. The known plug connector is provided for producing plug connections between backplanes and insertion cards, wherein, in the practical exemplary embodiment, plug connections between backplanes and insertion cards or so-called compact PCI systems are produced.

In the reference book by Meinke and Gundlach "Taschenbuch für Hochfrequenztechnik" ("Handbook for high frequency technology"), Springer-Verlag 1956, the basic terms of electrical technology such as capacitance, inductance and surge impedance are explained.

The object of the invention is to specify a plug connector that enables a high suppression of disturbing signals by simple means.

The object is solved by the features specified in the independent device claim.

Advantages of the Invention

The invention firstly relates to a plug connector that has contact elements that are divided into at least one signal contact element and at least one shielding contact element. The invention further relates to a component that is to contact the plug connector or is already contacting it, said component providing an electrical circuit ground. The plug connector according to the invention and the component are characterised by an ohmic resistor which connects a shielding contact element of the plug connector to the electrical circuit ground.

The plug connector according to the invention having the component is particularly suitable for connecting signal wire, via which high frequency signals, for example digital differential signals, broadcast, the data rate of which can be in the region of up to 20 gigabytes/second for example. Correspondingly, the base frequency of the signal frequency can be in the region of up to 20 gigahertz.

The measure provided according to the invention, namely the electrical connection of the at least one shielding contact element of the plug connector to a circuit ground via an ohmic resistor instead of a direct electrical connection avoids parasitic oscillations. Such parasitic oscillations which disadvantageously influence the signal-broadcasting ratio via the plug connector and considerably worsen the signal quality, can arise when the design height of the plug connector that is directly soldered to the electrical circuit ground, which provides the component, is in the region of the half surge length of the parasitic oscillations. The ohmic resistor provided according to the invention and inserted between a shielding contact element and the electrical circuit ground obviously works as damping resistor and prevents such parasitic oscillations already emerging.

Advantageous developments and embodiments of the plug connector according to the invention and of the component are respectively the subject matter of independent device claims.

A first embodiment provides that the resistance value of the ohmic resistor corresponds to the surge resistance of a signal wire guided via the plug connector (10). It has been ascertained in an experimental and calculated manner that an optimal suppression of parasitic oscillations is achieved by this calculation of the resistance value. According to one embodiment, the resistance value of the ohmic resistor can generally range from 20-100 ohms, wherein, according to a special embodiment, the resistance value of the ohmic resistor can be at least approximately 50 ohms.

Another embodiment provides that such a ohmic resistor is precisely allocated to a shielding contact element in each case. An alternative embodiment to this that reduces the required number of ohmic resistors provides that an ohmic resistor is allocated to several shielding contact elements, wherein the shielding contact elements are in this case directly electrically connected to one another.

The at least one ohmic resistor can already be arranged directly in the plug connector. Alternatively, the at least one ohmic resistor can be allocated to the component. Purely in principle, a division of the ohmic resistor could also be provided in which one part of the ohmic resistor is arranged within the plug connector and one part of the ohmic resistor on the component. Purely in principle, a free wire of the ohmic resistor can be provided in which the ohmic resistor is arranged neither directly within the plug connector nor directly on or in the component.

A particularly advantageous embodiment provides that the plug connector is surrounded by at least one shielding, wherein the shielding is preferably directly connected to the electrical ground circuit. The shielding effectively prevents the emission of disturbing signals from the plug connector and correspondingly extensively suppresses the coupling of external disturbing signals in the plug connector. The at least one shielding contributes to suppressing the parasitic oscillations if they emerge.

One development provides that the component is a circuit board. In particular, the circuit board can be a backplane circuit board which is provided for receiving insertion cards.

Another embodiment provides that the circuit board is a multi-layer circuit board and a layer of the multi-layer circuit board at least partially has an electrically conductive surface with the potential of the electrical circuit ground. A simple implementation of the electrical ground circuit becomes possible by this measure, wherein the flat design of the ground circuit at the same time provides a shielding effect.

One development provides that a plug connector corresponding to the plug connector is provided that has contact elements that are divided into at least one signal contact element and at least one shielding element. Furthermore, a second component having a second electrical ground circuit is provided. By doing so, a corresponding shielding contact element of the corresponding plug connector is connected to a second electrical ground circuit via an electrical resistor. It has become apparent that, by this measure, which is provided on both sides of the plug connector, a further improvement in the suppression of parasitic oscillations is achieved.

A further advantageous embodiment also contributes to this, said embodiment providing that, with plug connectors contacting one another, the electrical circuit ground that is allocated to the plug connector and a second electrical circuit ground that is allocated to the corresponding plug connector are directly electrically connected to each other. The potential compensation is preferably produced via contact elements within the two plug connectors.

A preferable usage of the plug connector and of the component or of the corresponding plug connector and of the second component is given by adjacent contact elements forming a signal contact element pair, wherein at least one shielding contact element is allocated to the signal contact element pair. This usage of the plug connector according to the invention and of the component is particularly suitable for connecting signal guiding wires which guide differential signals.

Further advantageous developments and embodiments of the plug connector according to the invention and of the component arise from further dependent claims and from the following description.

SHORT DESCRIPTION OF THE EXEMPLARY EMBODIMENTS

The exemplary embodiments are explained in more detail by the drawing.

Figure 2:
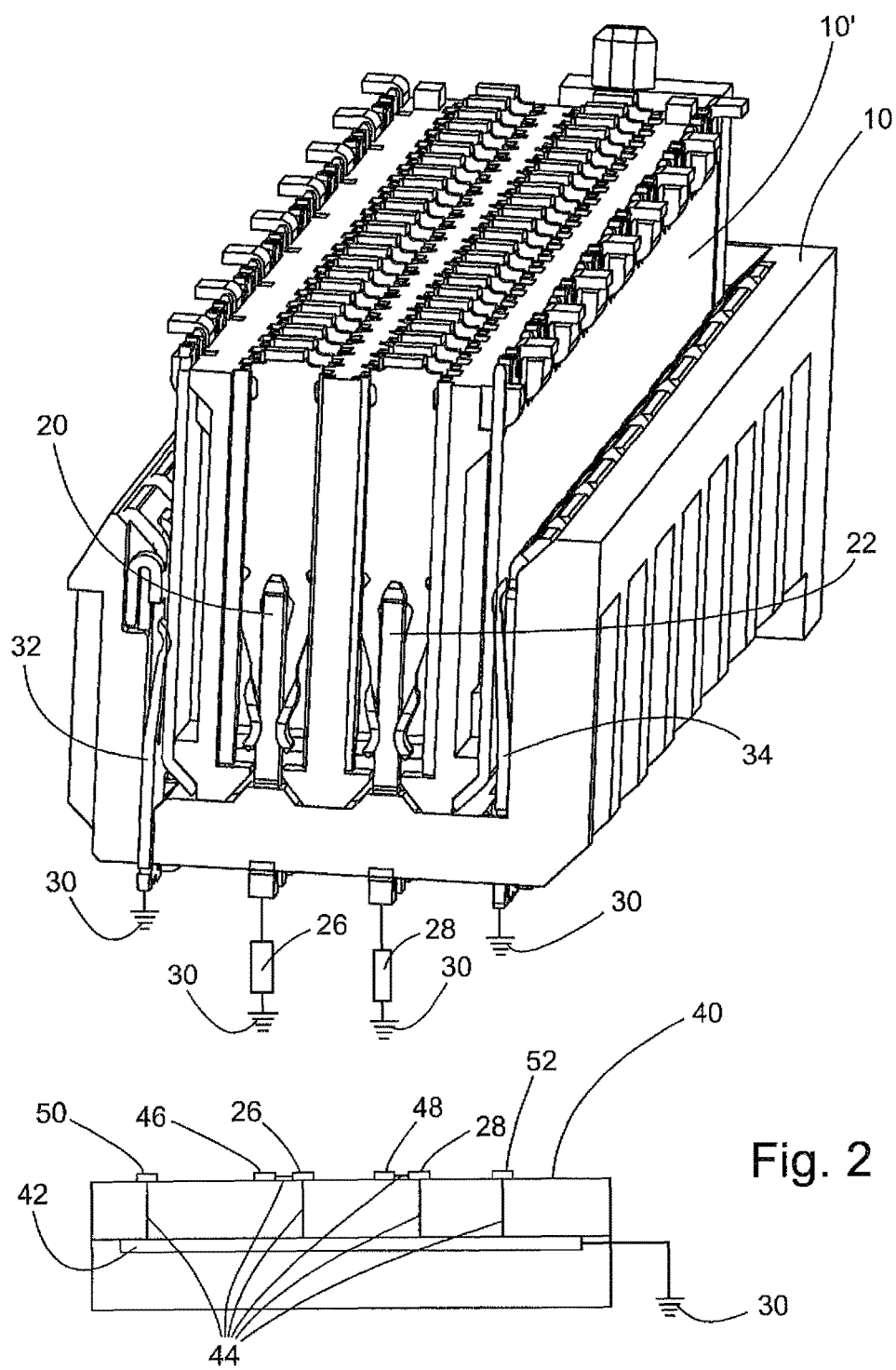
Figure 3:
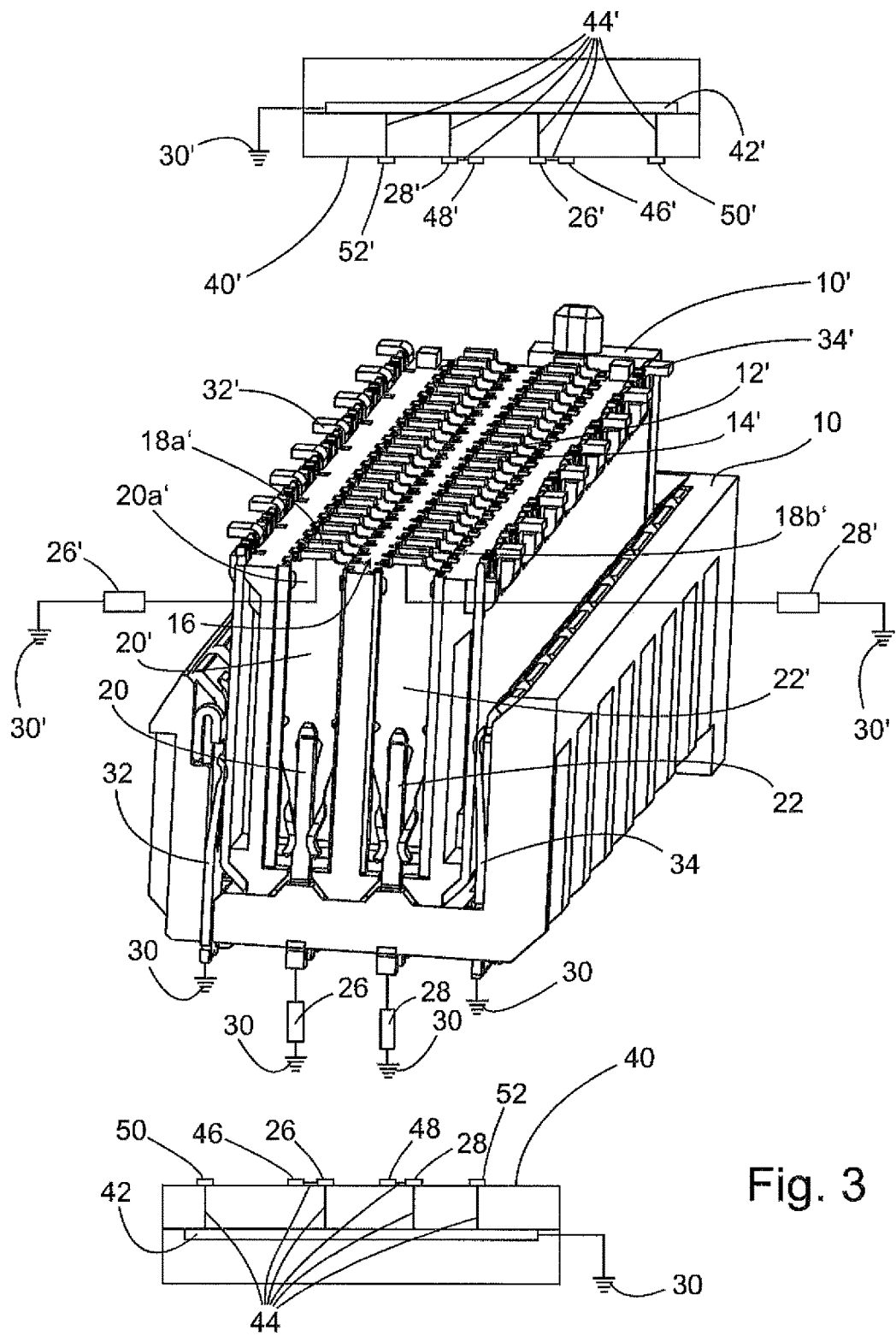
Figure 4:
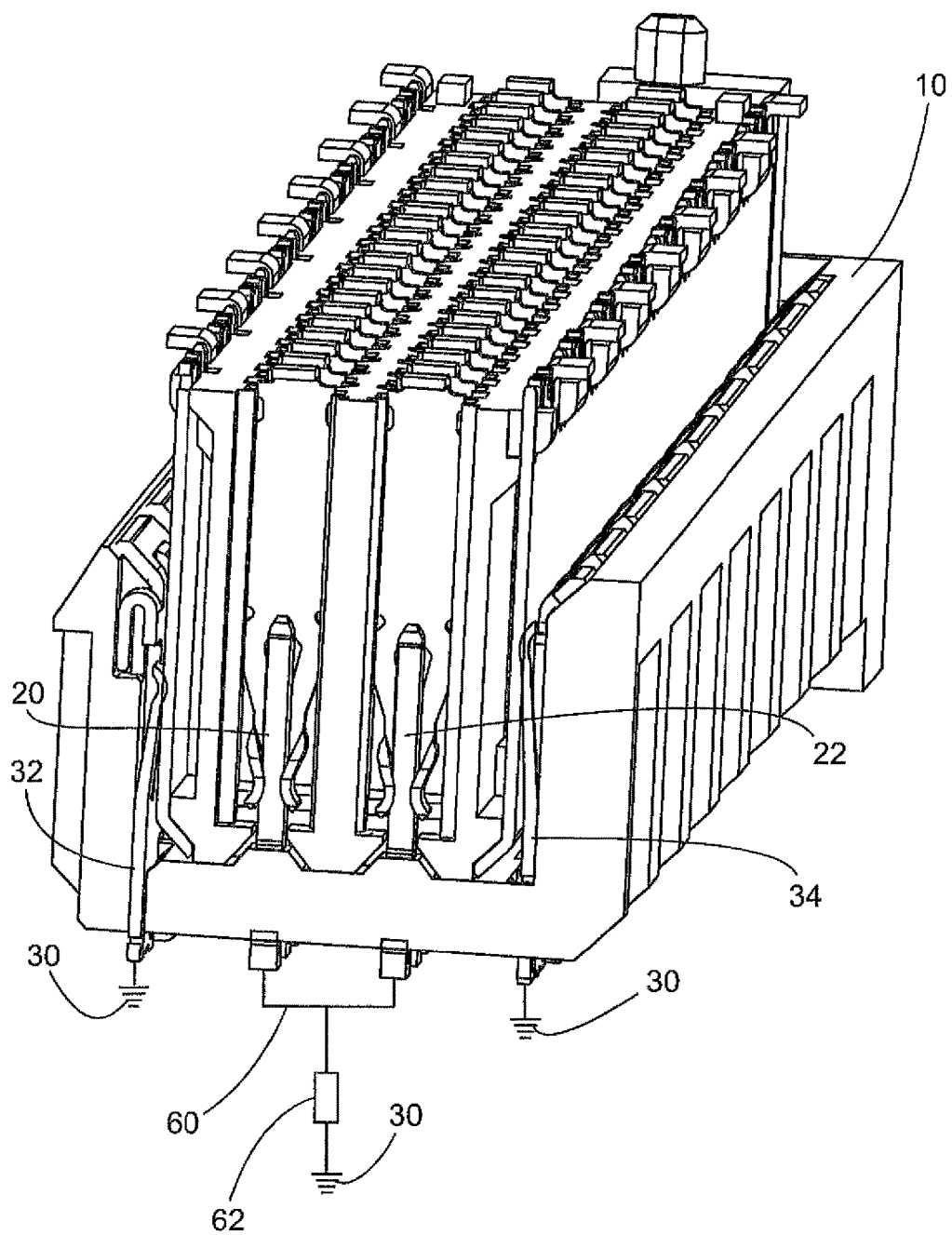
Figure 5:
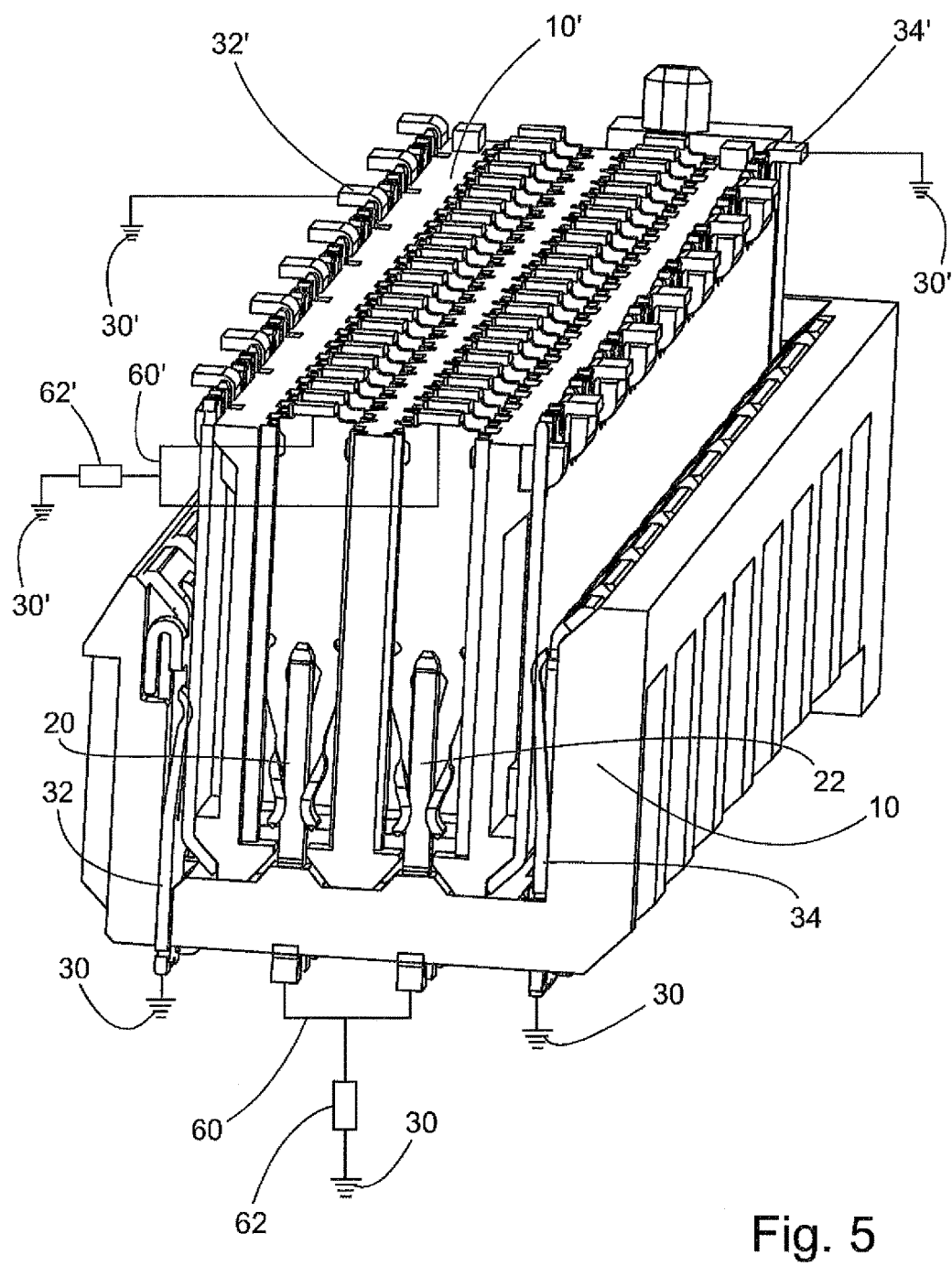

FIG. 1 schematically shows an aerial view of one layout of a plug connector,

FIG. 2 shows the plug connector before contacting with a component and a corresponding plug connector in the plugged together state, FIG. 3 shows the arrangement shown in FIG. 2, in which the corresponding plug connector is depicted before contacting with a second component, FIG. 4 shows an alternative exemplary embodiment of the arrangement shown in FIG. 2 and FIG. 5 shows an alternative exemplary embodiment of the arrangement shown in FIG. 3.

DETAILED DESCRIPTION OF THE EXEMPLARY EMBODIMENTS

FIG. 1 schematically shows an aerial view of one layout of a plug connector 10 that has at least two contact elements, preferably however a multitude of contact elements. The contact elements are divided up into at least one signal contact element and at least one shielding contact element. For example, a signal contact element 12 can be provided that is arranged to be adjacent to a shielding contact element 14.

In the depiction shown in FIG. 1, a symbol, such as a plus sign for example, should denote a signal contact element 12 and a hatching should denote a shielding contact element 14.

The shown signal contact element 12 and the adjacent shielding contact element 14 are provided to connect a signal guiding wire that is not shown, wherein the signal guiding wire can have a signal wire connected to the signal contact element 12 and a shielding wire connected to the shielding contact element 14.

The plug connector 10 can preferably be used for connecting signal guiding wires that contain at least one pair of signal guiding wire that is connected to a signal contact element pair 16 that comprises two directly adjacently arranged signal contact elements 18a, 18b. The signal contact element pair 16 is preferably used for connecting differential signals that are characterised by a plus symbol and by a minus symbol in FIG. 1. Such a differential signal has, in terms of a central level, for example a positive level on the one signal contact element (plus) and at the same time a negative level on the adjacent signal contact element (minus) of the signal contact element pair 16. The level changes in a push-pull manner with the signal frequency.

The signal guiding wire not shown that is connected to the signal contact element pair 16 contains at least one shielding wire, wherein, in the shown exemplary embodiment, two shielding wires should be provided that are to be connected in each case to a shielding contact element 20, 22. The shielding contact elements 20, 22 are preferably arranged directly adjacently with respect to the associated signal contact element pair 16 in order to achieve the best shielding effect.

It is provided according to the invention that at least one shielding contact element 14, 20, 22 is not connected directly to a first electrical circuit ground 30, but rather via an ohmic resistor 24, 26, 28. In the shown exemplary embodiment, along with the one shielding contact element 14, the shielding contact elements 20, 22 allocated to the signal contact element pair 16 are also connected in each case via an ohmic resistor 26, 28 to the first electrical circuit ground 30.

It should be noted that not every shielding contact element 14, 26, 28 of the connector plug 10 has to be connected to the electrical circuit ground 30 via an ohmic resistor, but can also be connected directly to the first electrical circuit ground 30.

The first electrical circuit ground 30 is present in a first component not shown in more detail in FIG. 1, the plug connector 10 either already being soldered to said component or is to be soldered as part of a mounting process.

The ohmic resistor 24, 26, 28 can be arranged within the plug connector 10. Alternatively or additionally, the ohmic resistor 24, 26, 28 can also be arranged on the first component.

Preferably, high frequency signals, for example digital differential signals, are broadcast via the connector plug 10, the data rate of said signals being able to be in the region of up to 20 gigabytes/second for example. K, corresponding to a base frequency of 20 gigahertz.

Based on experiments on practical plug connections that are supplied with very high data rates, it has been shown that, with direct contact of the shielding contact element 14, 20, 22 by the first electrical circuit ground 30, parasitic oscillations can arise which are in the frequency region of 17-18 gigahertz for example. Such a resonance point in a plug connection can disadvantageously influence the signal-broadcast ratio via the plug connector 10.

The unwanted resonance can be guided back along the length of the signal path in the plug connector 10. The previously mentioned resonance frequency in the region of around 17-18 gigahertz corresponds to a surge length of around 10 millimeters on the assumption that the effective relative dielectricity constant amounts to around 2.8. The plastics used for the plug connector 10 can have such a dielectricity constant. With an assumed design height of the plug connector 10 of 5 millimeters, the design height at least approximately corresponds to half the surge length and can therefore explain the emergence of the resonance.

The parasitic oscillations do not only influence the signal-broadcast ratio via the related signal contact element 12, 18a, 18b, but also adjacent signal contact elements because of the electro-magnetic expansion inside the plug connector 10 and should therefore also be avoided for this reason.

It has been found in a calculated and experimental manner that the ohmic resistor according to the invention 24, 26, 28 that is inserted between the shielding contact element 14, 20, 22 and the first electrical circuit ground 30 works as a damping resistor and extensively gets rid of the energy of the electrical oscillation at the resonance frequency that is emerging, such that the disturbing resonance frequency cannot form.

The resistance value of the ohmic resistor 24, 26, 28 is preferably in the region between 20-100 ohms. According to a special exemplary embodiment, the resistance value of the ohmic resistor 24, 26, 28 can amount to at least approximately 50 ohms. In particular, a resistance value of the ohmic resistor 24, 26, 28 that corresponds to the surge resistance of the signal wire guided via the plug connector 10 is suitable. Details for determining the capacitance coating and the inductance coating of the plug connector 10 and the surge resistance can be found in the reference book by Meinke and Gundlach stated at the beginning, in particular pages 14, 18 and 165.

The plug connector 10 preferably has a shielding 32, 34 that is directly connected to the first electrical circuit ground 30. In the shown exemplary embodiment it is assumed, for example, that the plug connector 10 has such a shielding 32, 34 on both sides and both shieldings 32, 34 are directly connected to the first electrical circuit ground 30.

Along with the plug connector shown in FIG. 1, FIG. 2 shows an exemplary embodiment of the first component 40 that is a plate, for example, with which the plug connector 10 is contacted during the mounting procedure. The first electrical circuit ground 30 is allocated to the first component 40.

The components shown in FIG. 2 that are identical to the components shown in FIG. 1 are in each case provided with the same reference sign. This agreement also applies to the following FIGS. 3-5.

According to FIG. 2, as an exemplary embodiment of the first component 40, the circuit board can be implemented as a multi-layer circuit board, for example. In doing so, the first electrical circuit ground 30 can preferably be implemented as an electrically conductive layer 42 on one of the layers of the multi-layer circuit board such that the first electric circuit ground 30 has a shielding effect at the same time.

If the ohmic resistor 24, 26, 28 is to be arranged on the first component 40 outside the plug connector 10, the ohmic resistor 24, 26, 28 is preferably positioned on the uppermost layer of the circuit board and is connected on one side to contact surfaces 46, 48 and on the other side to the first electrical circuit ground 30 via as short connection wires 44 as possible.

In the shown exemplary embodiment the two shieldings 32, 34 of the plug connector 10 are also to contact the contact surfaces 50, 52 or are already in contact with them, wherein the contact surfaces 50, 52 are also preferably connected to the first electrical circuit ground 30 on the shortest possible path via the connection wires 44, In the exemplary embodiment shown in FIG. 2, a plug connector 10' corresponding to the plug connector 10 is shown, the former being depicted in the state of being inserted into the plug connector 10.

FIG. 3 shows an exemplary embodiment according to which a second component 40', preferably also a circuit board, can also be allocated to the corresponding plug connector 10'. The second component 40' can again be implemented as a multi-layer circuit board. FIG. 3 also shows here a state in which the corresponding plug connector 10' is not yet in contact with the second component 40', for example by means of soldering.

The corresponding plug connector 10' should contain at least one corresponding contact element 12' and one corresponding shielding contact element 14'. Preferably, the corresponding plug connector 10', however, contains a multitude of contact elements, including at least one corresponding signal contact pair 16' that contains corresponding signal contact elements 18a', 18b', said contact pair being positioned to be adjacent to at least one corresponding shielding contact element 20', 22'.

Also, in the corresponding plug connector 10', the at least one corresponding shielding contact element 14', 20', 22' is not directly connected to a second electrical circuit ground 30', but also respectively via an ohmic resistor 26', 28'. In this case, the second electrical circuit ground 30' is allocated to the second component 40'.

It can also be provided in this exemplary embodiment that the ohmic resistor 26', 28' is arranged inside the second plug connector 10'. Preferably however, the ohmic resistor 26', 28' is provided on the second component 40' in this exemplary embodiment too.

In one implementation of the second component 40' as a multi-layer circuit board, the second electrical circuit ground 30' can again be formed on a separate layer of the multi-layer plate as a larger electrically conductive surface 42' in order to also achieve a shielding effect in the second component 40'.

If the ohmic resistor 24, 26, 28 is to be arranged outside the corresponding plug connector 10' on the second component 40', the ohmic resistor 24', 26', 28' is preferably again positioned on the uppermost layer of the circuit board and connected on one side to contact surfaces 46', 48' and on the other side to the second electrical circuit ground 30' by as short connection wires as possible.

According to the shown exemplary embodiment, the corresponding plug connector 10' can also have corresponding shieldings 32', 34' that are to contact the contact surfaces 50', 52' on the second component 40' or are already in contact with them, wherein the contact surfaces 50', 52' are also again preferably connected on the shortest possible path to the second electrical circuit ground 30' via connection wires 44'.

In the exemplary embodiment shown in FIG. 3, in which at least one ohmic resistor 26', 28' or a second electrical circuit ground 30' is also allocated to the corresponding plug connector 10', it is assumed that the first electrical circuit ground 30 of the first component 40 has the same potential as the second electrical circuit ground 30' on the second component 40'. To carry out the potential compensation it can be provided that at least one contact element of the plug connector 10 or of the corresponding plug connector 10' is provided for directly connecting the first electrical circuit ground 30 and the second electrical circuit ground 30'. Purely in principle, the potentials of the first and second electrical circuit ground 30, 30' could deviate from each other, however, in practice, the circuit grounds 30, 30' should be the same as far as possible.

FIG. 4 shows an embodiment that is an alternative to the exemplary embodiment shown in FIG. 2, according to the former embodiment at least two shielding contact elements 20a, 20b are directly electrically connected to each other by means of a connection 60, and wherein the shielding contact elements 20a, 20b connected to each other are connected to the first electrical circuit ground 30 via a single ohmic resistor 62. The electrical connection 60 can be inside the plug connector 10. Alternatively, the connection 60 between the at least two shielding contact elements 20a, 20b can be provided on the first component 40 that is no longer shown in FIG. 4. Likewise, the ohmic resistor 62 can be arranged for coupling the connection 60 to the first electrical circuit ground 30, either still in the plug connector 10, preferably however on the first component 40.

FIG. 5 shows an embodiment that is an alternative to the exemplary embodiment shown in FIG. 3, according to which former embodiment at least two corresponding shielding contact elements 20', 22' are directly electrically connected to each other by means of a connection 60' and wherein the directly corresponding shielding contact elements 20', 22' that are electrically connected to one another are connected to the second electrical circuit ground 30' via one single ohmic resistor 62'.

The electrical connection 60' can be inside the corresponding plug connector 10'. Alternatively, the connection 60' between the at least two shielding contact elements 20', 22' can be provided on the second component 40' no longer shown in FIG. 4. Likewise, the ohmic resistor 62' can be arranged for coupling the connection 60' to the second electrical circuit ground 30' either still in the corresponding plug connector 10', preferably however on the second component 40'.

The invention claimed is:

1. A connection system comprising a plug connector, a first component, and an ohmic resistor,
    wherein the plug connector has contact elements that are divided into at least one signal contact element and at least one shielding contact element,
    wherein the first component has a first electrical circuit ground, and
    wherein the ohmic resistor is provided between the shielding contact element and the first electrical circuit ground such that the ohmic resistor connects the shielding contact element to the first electrical circuit ground.

2. The connection system according to claim 1, wherein the resistance value of the ohmic resistor corresponds to the surge resistance of a signal wire guided across the plug connector.

3. The connection system according to claim 1, wherein the resistance value of the ohmic resistor ranges from 20-100 ohms.

4. The connection system according to claim 3, wherein the resistance value of the ohmic resistor amounts to at least approximately 50 ohms.

5. The connection system according to claim 1, wherein the ohmic resistor is in each case allocated exactly to a shielding contact element.

6. The connection system according to claim 1, wherein an ohmic resistor is allocated to several shielding contact elements and the shielding contact elements are directly electrically connected to one another.

7. The connection system according to claim 1, wherein the plug connector has a shielding and the shielding is provided to directly connect to the first electrical circuit ground.

8. The connection system according to claim 1, wherein the at least one ohmic resistor is arranged in the plug connector.

9. The connection system according to claim 1, wherein the at least one ohmic resistor is allocated to the first component.

10. The connection system according to claim 1, wherein the first component is a circuit board.

11. The connection system according to claim 10, wherein the circuit board is a multi-layer circuit board and a layer of the multi-layer circuit board has at least partially an electrical conductive surface having the potential of the first electrical circuit ground.

12. The connection system according to claim 10, further comprising a further plug connector, a second component, and an electrical resistor, wherein the further plug connector corresponds to the plug connector, wherein the further plug connector has contact elements that are divided into at least one signal contact element and at least one shielding element, wherein the second component has a second electrical circuit ground, and wherein at least one corresponding shielding contact element of the further plug connector is connected to the second electrical circuit ground via the electrical resistor.

13. The connection system according to claim 12, wherein with plug connectors contacting each other, the first electrical circuit ground and the second electrical circuit ground are directly electrically connected to each other.

14. The connection system according to claim 12, wherein the second component is a backplane circuit board.

15. The connection system according to claim 1, wherein adjacent contact elements form a signal contact element pair, and wherein the at least one shielding contact element is allocated to the signal contact element pair.

16. The connection system according to claim 15, wherein the signal contact element pair guides differential signals.

* * * * *